United States Patent
Rim et al.

(10) Patent No.: US 9,496,027 B2
(45) Date of Patent: Nov. 15, 2016

(54) STATIC RANDOM ACCESS MEMORY DEVICE INCLUDING WRITE ASSIST CIRCUIT AND WRITING METHOD THEREOF

(71) Applicant: Samsung Electronics Co., Ltd., Suwon-si (KR)

(72) Inventors: Woojin Rim, Seoul (KR); Taejoong Song, Seongnam-si (KR); Gyuhong Kim, Seoul (KR); Seong Ook Jung, Seoul (KR); Hanwool Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/793,044

(22) Filed: Jul. 7, 2015

(65) Prior Publication Data

US 2016/0042784 A1    Feb. 11, 2016

(30) Foreign Application Priority Data

Aug. 11, 2014  (KR) .................. 10-2014-0103762

(51) Int. Cl.
*G11C 11/412* (2006.01)
*G11C 11/419* (2006.01)

(52) U.S. Cl.
CPC .................... *G11C 11/419* (2013.01)

(58) Field of Classification Search
USPC ............................................ 365/154, 189.09
See application file for complete search history.

(56) References Cited

U.S. PATENT DOCUMENTS

| | | | |
|---|---|---|---|
| 6,504,761 B2 | 1/2003 | Kai et al. | |
| 7,212,458 B1 | 5/2007 | Takeda | |
| 7,570,527 B2 | 8/2009 | Houston | |
| 7,653,846 B2* | 1/2010 | Kim | G11C 11/419 714/718 |
| 8,363,453 B2 | 1/2013 | Arsovski | |
| 8,773,918 B2 | 7/2014 | Tanabe | |
| 8,842,464 B2 | 9/2014 | Jung et al. | |
| 2006/0262628 A1* | 11/2006 | Nii | G11C 5/063 365/226 |
| 2007/0081379 A1 | 4/2007 | Clinton et al. | |
| 2010/0110807 A1 | 5/2010 | Pious et al. | |
| 2010/0188909 A1* | 7/2010 | Kenkare | G11C 11/419 365/189.16 |
| 2011/0069574 A1 | 3/2011 | Hirabayashi | |
| 2012/0113708 A1 | 5/2012 | Jung et al. | |
| 2012/0206988 A1 | 8/2012 | Song et al. | |
| 2013/0322188 A1 | 12/2013 | Ono et al. | |

OTHER PUBLICATIONS

Chang, Jonathan, et al. "A 20nm 112Mb SRAM in High-K Metal-Gate with Assist Circuitry for Low-Leakage and Low-V MIN Applications." Solid-State Circuits Conference Digest of Technical Papers (ISSCC), 2013 IEEE International. IEEE, 2013. pp. 316-318.

(Continued)

*Primary Examiner* — Huan Hoang
*Assistant Examiner* — Minh Dinh
(74) *Attorney, Agent, or Firm* — Onello & Mello, LLP

(57) ABSTRACT

A static random access memory device may include a write driver configured to float one of a first bitline and a second bitline connected to a memory cell and apply a write voltage to the other bitline in response to a logic state of a data signal; a write failure detector configured to receive a voltage of the floated bitline and output a write failure signal; and an assist voltage generator configured to generate a write assist voltage in response to the write failure signal. The write driver may additionally provide the write assist voltage to a bitline to which the write voltage is applied.

20 Claims, 11 Drawing Sheets

(56) References Cited

OTHER PUBLICATIONS

Mann, Randy W. et al., "New Category of Ultra-Thin Notchless 6t SRAM Cell Layout Topologies for Sub-22nm.", Quality Electronic Design (ISQED), 2011 12th International Symposium on. IEEE, 2011. pp. 425-430.

Mukhopadhyay, Saibal, et al. "SRAM write-ability Improvement with Translent Negative Bit-Line Voltage." Very Large Scale Integration (VLSI) Systems, IEEE Transactions on 19.1 (2011), pp. 24-32.

\* cited by examiner

STATIC RANDOM ACCESS MEMORY DEVICE INCLUDING WRITE ASSIST CIRCUIT AND WRITING METHOD THEREOF

CROSS-REFERENCE TO RELATED APPLICATIONS

This U.S. non-provisional patent application claims priority under 35 USC §119 to Korean Patent Application No. 10-2014-0103762, filed on Aug. 11, 2014, the disclosure of which is incorporated by reference in its entirety herein.

BACKGROUND

1. Technical Field

Embodiments of the present disclosure relate to static random access memory devices and, inure particularly, to static random access memory devices including a write assist circuit and a writing method thereof.

2. Discussion of Related Art

A memory cell of an SRAM device can encounter instable write operations due to a number of factors, including process variation that may occur during a fabrication process thereof. As a result, a typical SRAM device utilizes a write assist circuit to assist a write operation. The write assist circuit can adjust a voltage applied to a cell during a write operation such that the adjusted voltage is temporarily more advantageous during the write operation.

Among memory cells of an SRAM device, only a small number of memory cells actually require a write assist operation. However, it is common for the write assist operation to be performed on all of the memory cells. That is, since the write assist operation is performed even on those memory cells that do not require the write assist operation, a relatively large amount of power is unnecessarily consumed.

SUMMARY

The present disclosure relates to a static random access memory device and a writing method thereof.

A static random access memory device according to an embodiment of the inventive concept may include a write driver configured to float either of a first bitline and a second bitline connected to a memory cell and apply a to write voltage to the other bitline in response to a logic state of a data signal; a write failure detector configured to receive a voltage of the floated bitline and output a write failure signal; and an assist voltage generator configured to generate a write assist voltage in response to the write failure signal. The write driver may additionally provide the write assist voltage to the bitline to which the write voltage is applied.

In some embodiments, the voltage of the floated bitline is a logic-high voltage and the write voltage is a logic-low voltage.

In some embodiments, the write assist voltage is a negative voltage at a voltage level lower than the write voltage.

In some embodiments, the write driver comprises: a first inverter configured to receive and invert the data signal before outputting the data signal; a first write transistor having one end connected to the first bitline and the other end connected to an output terminal of the assist voltage generator and being turned on or off in response to an output signal of the first inverter; and a second write transistor having one end connected to the second bitline and the other end connected to the output terminal of the assist voltage generator and being turned on or off in response to the data signal, wherein turn-on/off operations of the first and second write transistors are complementary to each other.

In some embodiments, the write failure detector comprises: a first select transistor configured to output a voltage of the first bitline as a first select signal in response to the data signal; a second select transistor configured to output a voltage of the second bitline as a second select signal in response to the output signal of the first inverter; and a logic unit configured to receive the first select signal or the second select signal as a first input signal and receive and logically operate an write enable signal maintaining a logic low state during a write operation as a second input signal to output a write failure signal, and wherein the first input signal is a voltage of the floated bitline.

In some embodiments, the logic unit outputs a logic-high write failure signal when the first input signal is a logic-low voltage.

In some embodiments, the logic unit is a NOR logic gate.

In some embodiments, the assist voltage generator comprises: an inverter chain including first to third inverters connected in series and receiving and inverting the write failure signal to output an assist voltage control signal; a capacitor having one end connected to an output terminal of the inverter chain and the other end connected to an output terminal of the assist voltage generator and outputting the write assist voltage in response to the assist voltage control signal; and a pull-down transistor having one end connected to a ground voltage and the other end connected to the output terminal of the assist voltage generator and outputting a ground voltage in response to an output signal of the first inverter.

In some embodiments, the assist voltage generator outputs the write assist voltage when the write failure signal is logic low and outputs a ground voltage when the write failure signal is logic high.

A static random access memory device according to another embodiment of the inventive concept may include memory cells connected to wordlines and bitlines pairs, respectively; an address decoder configured to select one of the memory cells in response to an address signal; a write driver configured to float one bitline of a bitline pair connected to the memory cell selected by the address decoder and apply a write voltage to the other bitline; a write failure detector configured to detect change of a voltage level of the floated bitline to output a write failure signal; and an assist voltage generator configured to output a write assist voltage in response to the write failure signal. The write failure detector may output a write failure signal corresponding to write operation failure when a logic state of the voltage level of the floated bitline changes, and the write driver may additionally apply the write assist voltage to the bitline to which the write voltage is applied.

In some embodiments, the write driver floats a first bitline of the bitline pair and applies the write voltage to a second bitline of the bitline pair when the data signal is logic high, and applies the write voltage to the first bitline and floats the second bitline of the bitline pair when the data signal is logic low.

In some embodiments, a voltage level of the floated bitline is a precharge voltage level and a level of the write voltage is a ground voltage level.

In some embodiments, the write failure detector outputs the write failure signal that is a logic-high voltage when the voltage level of the floated bitline changes from a logic-high level to a logic-low level.

In some embodiments, the write assist voltage generator outputs a write assist voltage that is a negative voltage at a voltage level lower than the write voltage in response to the write failure signal.

In some embodiments, the write assist voltage generator outputs a ground voltage to the write driver when the write failure signal is a logic-low voltage.

A writing method of a static random access memory device according to an embodiment of the inventive concept may include floating one bitline of a bitline pair connected to a memory cell and applying a write voltage to the other bitline in response to a data signal; detecting change of a voltage level of the floated bitline to determine whether a write operation fails; generating a write assist voltage when the write operation fails; and additionally applying the generated write assist voltage to the bitline to which the write voltage is applied.

In some embodiments, a voltage of the floated bitline is a logic-high voltage and the write voltage is a logic-low voltage.

In some embodiments, detecting change of a voltage level of the floated bitline to determine whether a write operation fails includes detecting failure of the write operation when the voltage level of the floated bitline changes from a logic high level to a logic low level.

In some embodiments, a voltage level of the floated bitline is a precharge voltage level and a level of the write voltage is a ground voltage level.

In some embodiments, the write assist voltage is a negative voltage at a voltage level lower than the ground voltage.

A write assist operation unit in accordance with another aspect of the present inventive concepts is coupled to a bitline pair of a memory device, and comprises a write failure detection circuit determining when a write error occurs in response to a voltage level of a first bitline of the bitline pair, the write detection circuit generating a write failure signal in response to a determination of the occurrence of a write error; and a write driver unit that receives the write failure signal and selectively applies a write assist voltage to the first bitline of the bitline pair only when the write failure signal indicates the occurrence of a write error and otherwise applies a write voltage to the first bitline of the bitline pair when the write failure signal indicates the non-occurrence of a write error.

In some embodiments, the write assist voltage is at a voltage level that is lower than that of the write voltage.

In some embodiments, the write assist voltage is at a negative voltage level.

In some embodiments, the write assist operation unit further comprises a write driver that places the first bitline of the bitline pair in a floating state and that applies a write voltage to a second bitline of the bitline pair during a write operation.

In some embodiments, the write failure detection circuit determines an occurrence of a write error based on a voltage of the first bitline decreasing below a threshold voltage.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
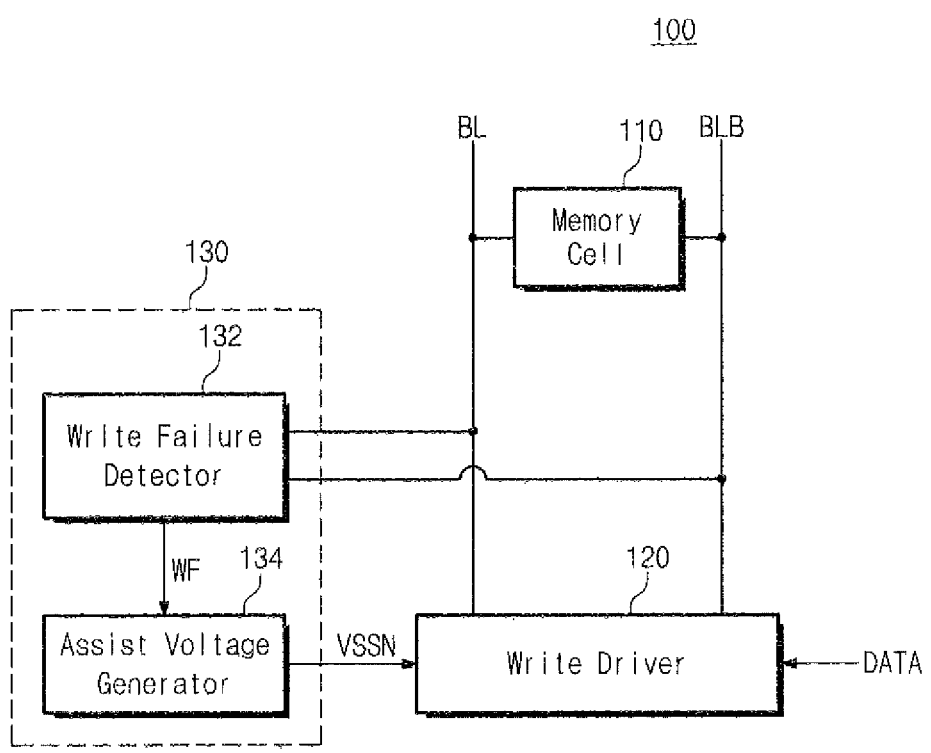
FIG. 1 is a block diagram of an SRAM device according to an embodiment of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein is for the purpose of describing particular embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The exemplary embodiments of the inventive concepts will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the inventive concepts are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the inventive concepts.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

Terms such as "front side," and "back side" may be used in a relative sense herein to facilitate easy understanding of the inventive concepts. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

FIG. 1 is a block diagram of a static random access memory (SRAM) device 100 according to an embodiment of the inventive concepts. As illustrated, the SRAM device 100 includes a memory cell 110, a write driver 120, and a write assist circuit 130. The write driver 120 writes data into the memory cell 110 corresponding to a data signal DATA. The write assist circuit 130 includes a write failure detector 132 that detects failure of a write operation performed by the write driver 120 and outputs a write failure signal WF and an assist voltage generator 134 that outputs a write assist voltage VSSN when the write operation fails.

The write driver 120 operates to float one of a first bitline BL and a second bitline BLB and applies a write voltage to the other of the first and second bitlines BL, BLB in response to the data signal DATA. For example, a voltage level of the floated bitline may be logic 'high' and a write voltage level may be logic 'low'.

The write failure detector 132 operates to output the write failure signal WF in response to a change in the voltage level of the floated bitline. The write failure detector 132 may output a logic-high write failure signal WF when the voltage level of the bitline floated during the write operation changes. In some embodiments, the logic-high write failure signal WF may indicate a write operation failure of the write.

The assist voltage generator 134 may generate the write assist voltage VSSN in response to the write failure signal WF. For example, when the write failure signal WF is a logic-high signal, the assist voltage generator 134 may generate the write assist voltage VSSN. The write assist voltage VSSN may be a negative voltage lower than a logic-low write voltage. The generated write assist voltage VSSN is additionally applied to a bitline applied with the write voltage through the write driver 120 to assist the write operation.

Figure 2:
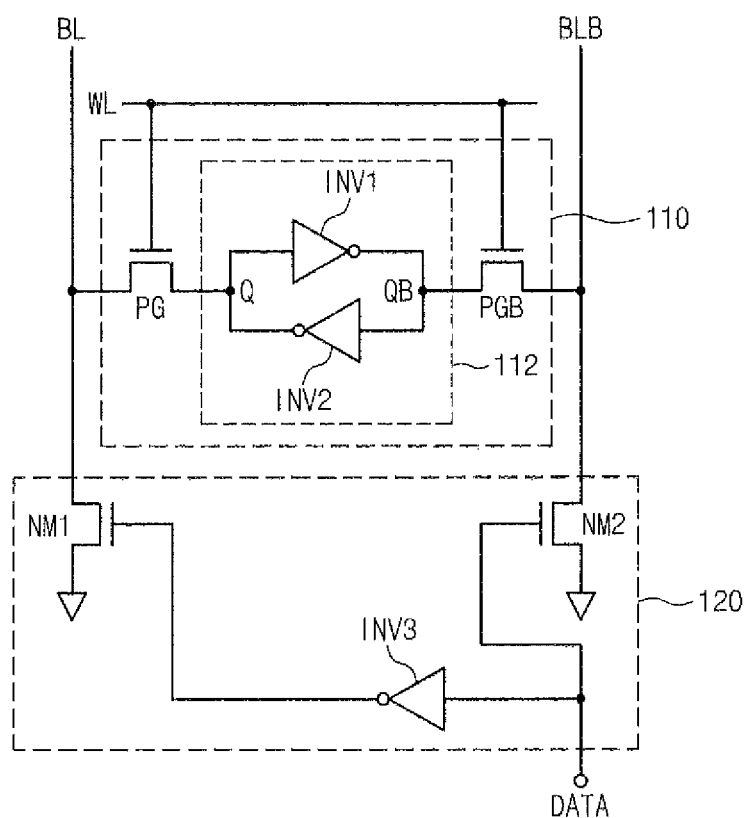
FIG. 2 is an exemplary circuit diagram of a write driver and a memory cell according to the inventive concepts.

FIG. 2 is an exemplary circuit diagram of a write driver 120 and a memory cell 110 according to the inventive concepts. As illustrated, the memory cell 110 includes a latch circuit 112 including inverters INV1 and INV2 and pass gates PG and PGB. The write driver 120 includes an inverter INV3 and write transistors NM1 and NM2 to float one bitline of a bitline pair (BL, BLB) and apply a write driver to the other bitline.

Figure 3A:
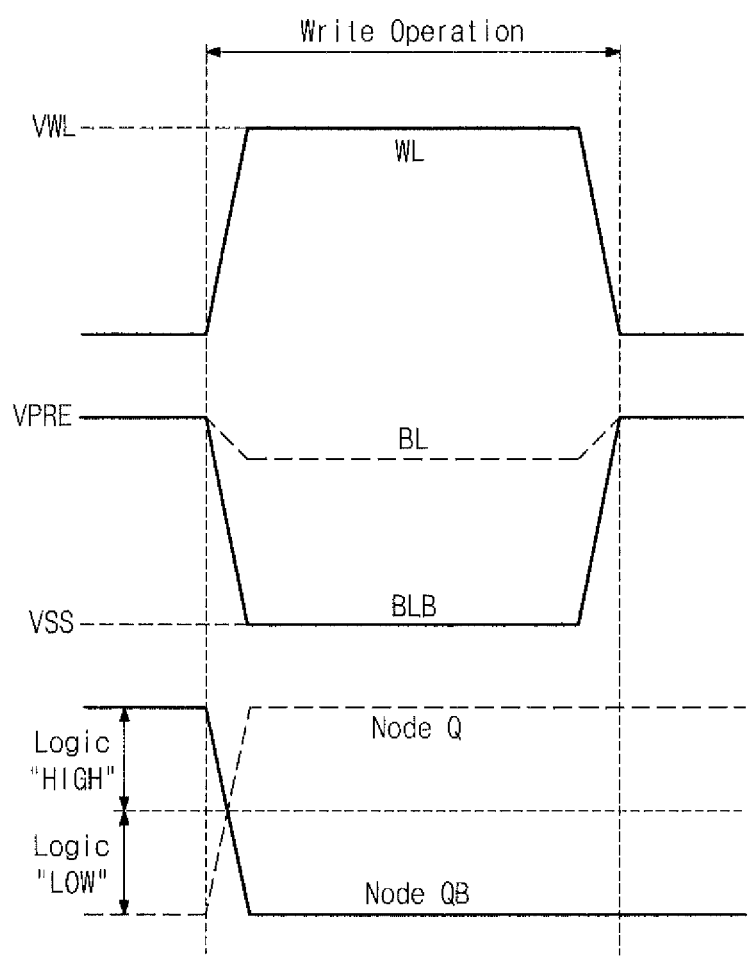
FIGS. 3A and 3B are a timing diagram illustrating a write operation performed by a write driver according to the inventive concepts
Figure 3B:
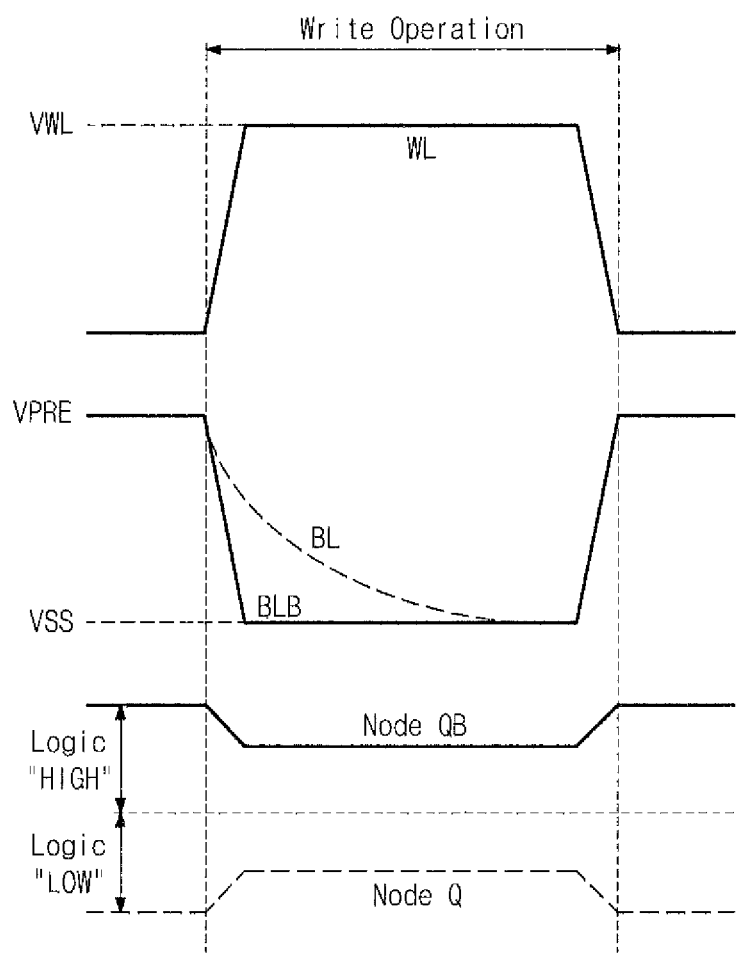

FIGS. 3A and 3B are a timing diagrams illustrating a write operation performed by a write driver according to the inventive concepts. FIG. 3A illustrates a case where the write operation is successfully performed, and FIG. 3B illustrates a case where the write operation fails. Hereinafter, the write operation will be described in further detail with reference to FIGS. 2, 3A, and 3B.

A data value stored in a first data node Q is a reference of a time at which data is written into the memory cell 110. That is, for purpose of the present discussion, let it be assumed that when a logic state of the first data node Q is logic 'high', logic-high data is stored in the memory cell 110. A write operation described hereinafter will be described based on an operation to write logic-high data into the memory cell 110. Accordingly, prior to the write operation, a first data node Q is logic 'low' and a second data node QB is logic 'high'. In addition, prior to the write operation, a first bitline BL and a second bitline BLB are precharged to a precharge voltage VPRE.

With reference to FIGS. 2 and 3A, a description will now be made with respect to a case where a write operation is successfully performed.

When a wordline voltage VWL is applied to a wordline WL, a first pass gate PG and a second pass gate PGB are turned on. Thus, the first bitline BL and the first data node Q are electrically connected to each other and the second bitline BLB and the second data node QB are electrically connected to each other. The write driver 120 receives a logic-high data signal DATA. A second write transistor NM2 is turned on in response to the data signal DATA. The second write transistor NM2 drives the second bitline BLB to a ground voltage (VSS) level. A voltage level of the logic-high second data node QB decreases to the ground voltage (VSS) level.

In the meantime, a first write transistor NM1 is turned off in response to an output signal of an inverter INV3. Thus, the first bitline BL is floated. Due to a difference in voltage between the first bitline BL and the first data node Q, current flows from the first bitline BL to the first data node Q to decrease a voltage of the first bitline BL. However, since a voltage of the second node QB is made equal to a voltage of the second bitline BLB driven to the ground voltage level, voltage drop of the first data node Q is prevented. When the write operation is successfully performed, a voltage level of each bitline and a voltage level of a data node connected to each bitline are made equal to each other. Thus, the decreased amount of the voltage of the floated first bitline BL is significantly reduced. That is, when the write operation is successfully performed, a logic state of the floated bitline does not change. From the description of FIG. 3A, it can be seen that when the write operation is successfully performed, the decreased amount of the voltage of the first bitline BL is relatively small.

Referring to FIGS. 2 and 3B, a description will now be presented with respect to a case where a write operation fails.

Failure of a write operation may occur when operating characteristics of a memory cell are deteriorated due to process variation that may occur during a process of the memory cell. This means that a logic state of a data node of the memory cell does not change even when a write driver applies a voltage corresponding to a logic state that a write driver desires to write into a bitline.

As described above, the write driver 120 floats the first bitline BL and drives the second bitline BLB to a ground voltage VSS. However, the logic states of the first data node Q and the second data node QB are maintained at previous logic states due to deterioration of the operating characteristics of the memory cell. Thus, the first data node Q is maintained at a logic-low voltage. Accordingly, current continues to flow from the first bitline BL to the first data node Q due to a voltage difference, which causes the voltage of the first bitline BL to decrease. From the timing diagram of FIG. 3B, it can be seen that the logic states of the first data node Q and the second data node QB do not change. In addition, it can be seen that the voltage of the first bitline BL continues to decrease to a logic low voltage.

As described above, a voltage of a floated bitline does not substantially change when a write operation is successfully performed. But a voltage change is great when the write operation fails. Accordingly, by using the voltage change of the floated bitline, a determination can be made as to whether the write operation has failed.

Figure 4:
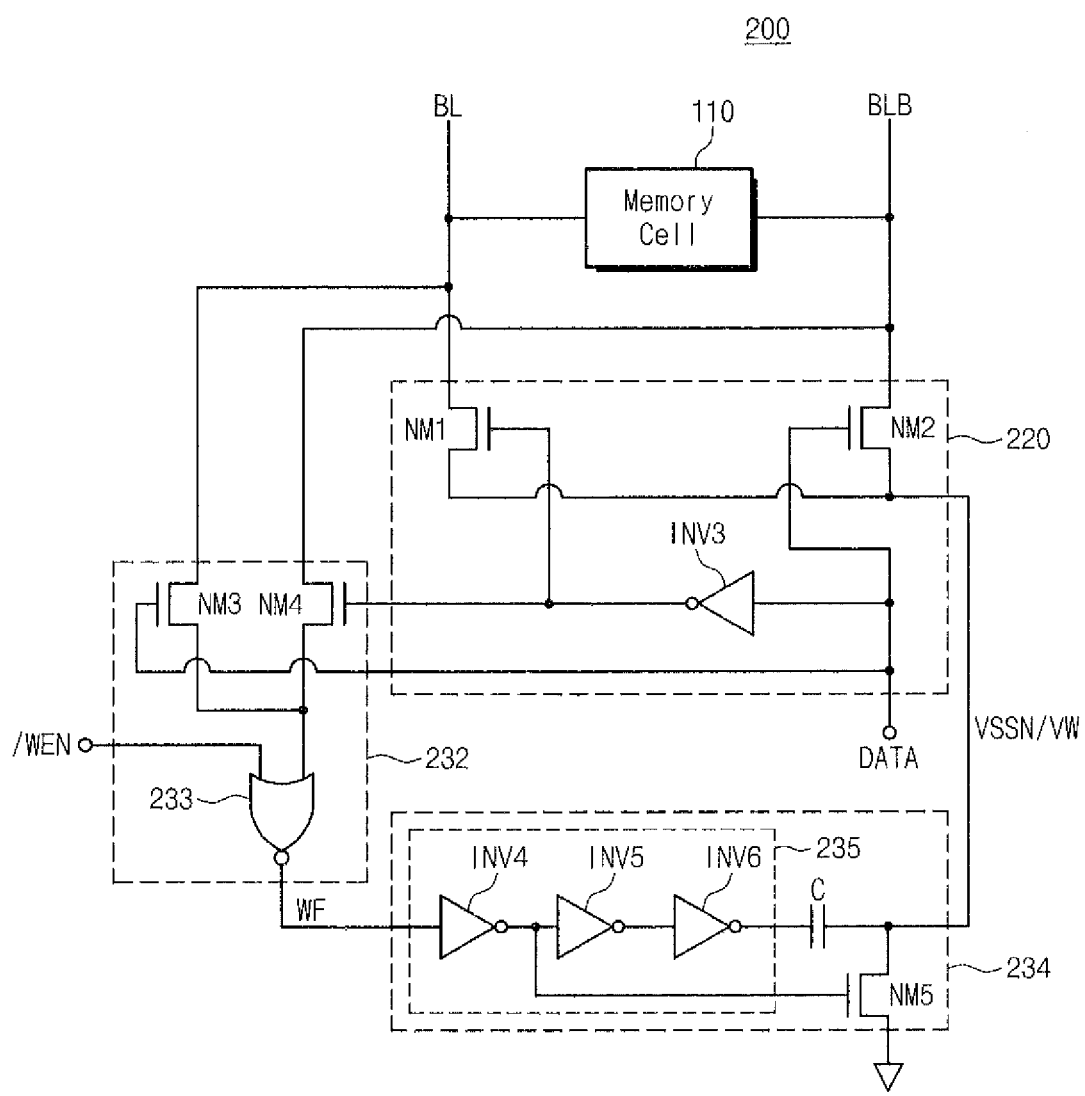
FIG. 4 is an exemplary circuit of an SRAM device according to FIG. 1.

FIG. 4 is an exemplary circuit of an SRAM device 200 according to FIG. 1. As illustrated, the SRAM device 200 includes a write driver 220, a write failure detector 232, and an assist voltage generator 234. In this configuration, the write driver 220 receives a write assist voltage VSSN or a write voltage VW from the assist voltage generator 234. The write failure detector 232 selectively receives a voltage level of a bitline of a bitline pair (BL, BLB) that is floated in response to a data signal DATA. The assist voltage generator 234 outputs the write assist voltage VSSN or the write voltage VW in response to a logic state of a write failure signal WF.

The write driver 220 floats a bitline at the side that desires to be at a logic high state and drives a bitline at the side that desires to write a logic low state to be at a ground voltage. For achieving this, the write driver 220 includes a first write transistor NM1, a second write transistor NM2, and an inverter INV3.

One end of the first write transistor NM1 is connected to the first bitline BL. The other end of the first transistor NM1 is connected to an output terminal of the assist voltage generator 234 and is turned on and off in response to an output signal of the inverter INV3. The first write transistor NM1 operates to float the first bitline BL or applies a write voltage to the first bitline BL in response to the output signal of the inverter INV3.

One end of the second write transistor NM2 is connected to the second bitline BLB. The other end of the second write transistor NM2 is connected to an output terminal of the assist voltage generator 234 and is turned on and off in response to a data signal DATA. The second write transistor NM2 operates to float the second bitline BLB or applies the write voltage to the second bitline BLB in response to the data signal DATA. In some embodiments, the turn on/off operations, in other words, the activation/deactivation of the first transistor NM1 and the second transistor NM2 are complementary to each other.

The write failure detector 232 includes a first select transistor NM3, a second select transistor NM4, and a logic gate 233. The first select transistor NM3 and the second select transistor NM4 selectively input a voltage level of a floated bitline to the logic gate 233. The logic gate 233 logically operates the voltage level of the floated bitline and a write enable signal and outputs a write failure signal WF.

One end of a first select gate NM3 is connected to the first bitline BL. The other end of the first select gate NM3 is connected to a first input terminal of the logic gate 233 and is turned on/off in response to the data signal DATA. One end of the second select gate NM4 is connected to the second bitline BLB. The other end of the second select transistor NM4 is connected to the first input terminal of the logic gate 233 and is turned on/off in response to an output signal of the inverter INV3. The data signal DATA and the output signal of the inverter INV3 are complementary to each other. Thus, the first select gate NM3 and the second select gate NM4 serve as a multiplexer to selectively apply the voltage level of the floated bitline to the logic gate 233.

The logic gate 233 receives a voltage level signal of the floated bitline as a first input signal and receives a write enable signal /WEN as a second input signal, and logically operates the first and second input signals. In some embodiments, the write enable signal /WEN maintains a logic low state during the write operation. When the write operation fails, the voltage of the floated bitline continues to decrease to a logic low level. If the logic gate 233 is a NOR logic gate, the logic gate 233 outputs a logic-high signal when the first input signal is logic 'low' and the second input signal is logic 'low'. That is, the write failure detector 232 outputs a logic-high write failure signal WF only when both the first and second input signals are logic 'low'. Thus, the logic-high write failure signal WF indicates a failure of the write operation.

In some embodiments, the assist voltage generator 234 may include an inverter chain 235, a capacitor C, and a pull-down transistor NM5. The write failure signal WF is inverted and output by the inverter chain 235 including inverters INV4, INV5, and INV6 connected in series. The capacitor C outputs the write assist voltage VSSN according to a logic state of the write failure signal WF. The pull-down transistor NM5 outputs the write voltage VW in response to the output signal of the inverter INV4. The operation of the assist voltage generator 234 will be described below in further detail with reference to FIG. 5.

Figure 5:
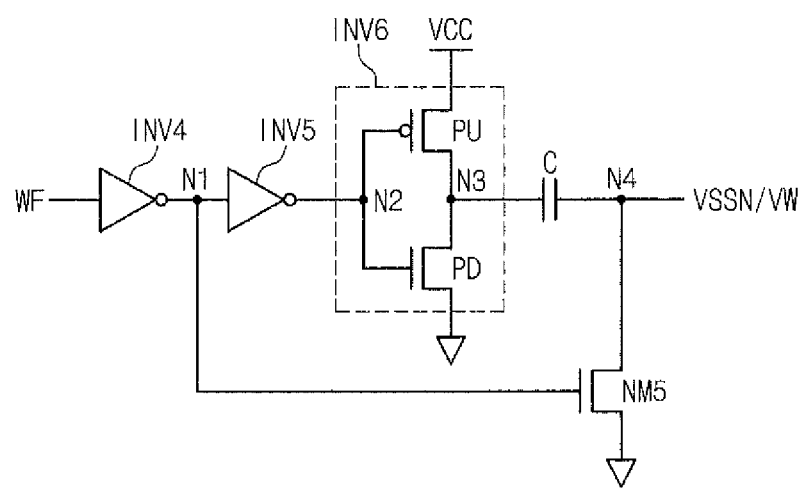
FIG. 5 is an exemplary circuit diagram of an assist voltage generator according to FIG. 4.

FIG. 5 is an exemplary circuit diagram of the assist voltage generator 234 according to FIG. 4. The operation of the assist voltage generator 234 according to a logic state of the write failure signal WF will be described below with reference to FIG. 5.

In a first case, a logic-low write failure signal WF is input to the inverter INV4. The inverter INV4 outputs a logic-high signal to an output node N1. The pull-down transistor NM5 is turned on in response to the logic-high signal of the output node N1. Thus, the pull-down transistor NM5 drives the output node N4 to a ground voltage level. The inverter INV5 outputs a logic-low signal to an output node N2. A pull-up transistor PU of the inverter INV6 is turned on and a pull-down transistor PD thereof is turned off in response to the logic-low signal of the output node N2. Thus, the pull-up transistor PU drives an output node N3 to a power supply voltage (VCC) level. The capacitor C is charged to the power supply voltage (VCC) level.

In another case, when a write operation fails, a logic-high write failure signal WF is input to the inverter INV4. The inverter INV4 outputs a logic-low signal to the output node N1. The pull-down transistor NM5 is turned off in response to the logic-low signal of the output node N1. The inverter INV5 outputs the logic-high signal to the output node N2. The pull-up transistor PU of the inverter INV6 is turned off and the pull-down transistor PD thereof is turned on in response to the logic-high signal of the output node N2. Thus, the pull-down transistor PD drives the output node N3 to the ground voltage level. At this point, the capacitor C is in a state charged to the power supply voltage (VCC) level. As the output node N3 is driven to the power supply voltage (VCC) level, the capacitor C outputs a negative voltage to the output node N4 of the assist voltage generator 234. That is, a voltage of −VCC level is output to the output node N4. As a result, the capacitor C is charged when the write failure signal WF is logic 'low' and the capacitor outputs the negative voltage to the output node N4 when the write failure signal WF is logic 'high'.

The assist voltage generator 234 according to the inventive concept temporarily generates a negative voltage by using the above-mentioned capacitor coupling without use of a separate voltage source for generating a negative voltage. Thus, any power overhead involved due to the use of a separate voltage source may be eliminated.

Figure 6:
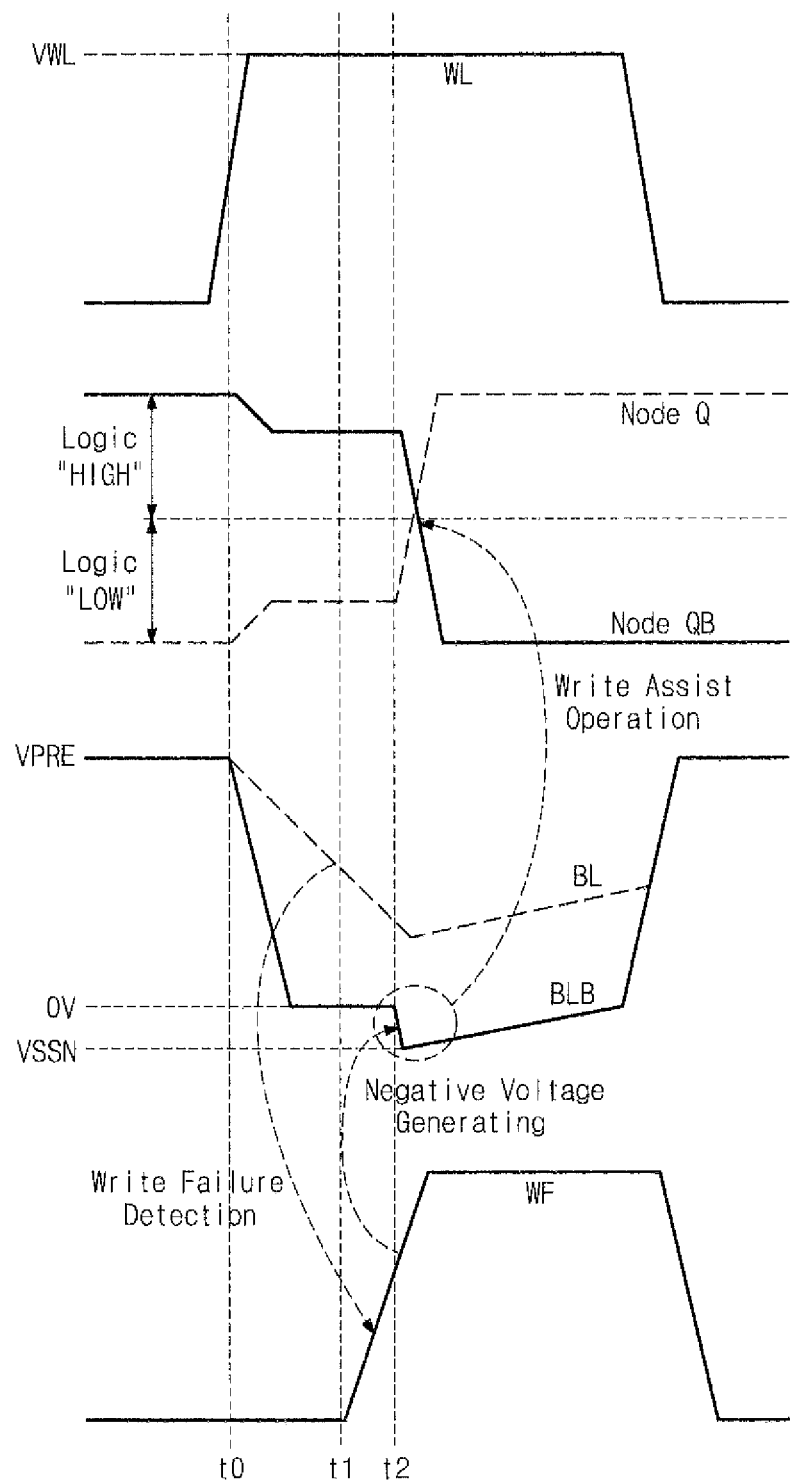
FIG. 6 is a diagram illustrating a write assist operation according to the inventive concepts.

FIG. 6 is a timing diagram illustrating a write assist operation according to the inventive concepts. With reference to FIGS. 2, 4, and 6, a detailed description will be made hereinafter with respect to the write assist operation according to the inventive concepts in the case where a write operation fails.

A wordline voltage VWL is applied to a wordline WL in response to a wordline enable signal. The pass gates PG and PGB of the memory cell 110 are turned on at a time t0 in response to the wordline voltage VWL applied to the pass gates PG and PGB of the memory cell 110. The first bitline BL is floated by the write driver 220, and the second bitline BLB is applied with the write voltage VW.

As shown and described above in connection with FIG. 3B, when the write operation fails, the voltage level of the first bitline BL continues to decrease toward a logic low state. As the voltage level of the first bitline BL decreases, a voltage level of the write failure signal WF starts to increase at a time t1. The write failure signal WF fully transitions to a logic high state at a time t2. When the write failure signal WF fully transitions to the logic high state, the assist signal generator 234 outputs a write assist voltage VSSN that is a negative voltage.

The output write assist voltage VSSN is provided to a bitline applied with the write voltage, i.e. the bitline that is not floated, through the write driver 220. When a negative voltage is applied to the bitline applied with the write voltage VW, an increased amount of current flows from the second data node QB to the second bitline BLB. Accordingly, a voltage level of the second data node QB decreases, and a logic state of the second data node QB may be changed from a logic high state to a logic low state. In addition, as the voltage level of the second data node QB decreases, the voltage level of the first data node Q increases to a logic high state. Thus, data of a desired logic state is properly written into the data nodes Q and QB, as a result of the write assist operation of the present inventive concepts.

According to the inventive concepts, a write operation is assisted by additionally applying a write assist voltage VSSN that is a negative voltage lower than a ground voltage VSS to a bitline driven to a write voltage VW that is a ground voltage (VSS) level. Only at times when a when a write operation fails, a write assist operation is selectively performed. In this manner, power consumption is relatively reduced during the write operation.

Figure 7:
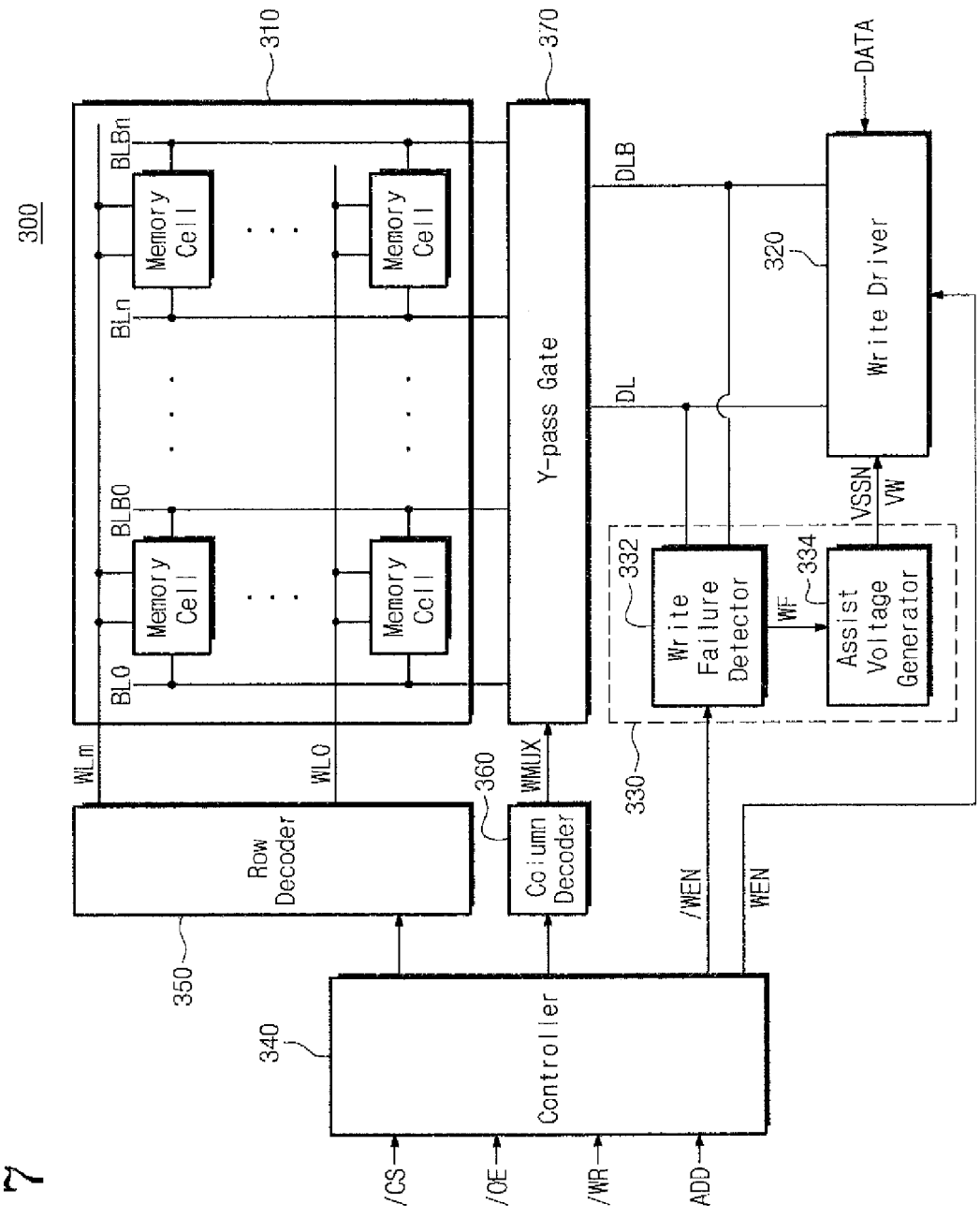
FIG. 7 is a block diagram of an SRAM device according to another embodiment of the inventive concepts.

FIG. 7 is a block diagram of an SRAM device 300 according to another embodiment of the inventive concepts. As illustrated, the SRAM device 300 includes a memory cell array 310, a write driver 320, a write assist circuit 330, a controller 340, a row decoder 350, a column decoder 360, and a Y-pass gate 370.

The memory cell array 310 includes a plurality of memory cells to store data. In some embodiments, each of the memory cells may comprise a 6T SRAM cell including six transistors. Alternatively, in some embodiments, each of the memory cells may comprise an 8T SRAM cell including eight transistors.

The memory cells included in the memory cell array 310 are connected to a plurality of wordlines and a plurality of bitline pairs, respectively. The memory cells are individually selected by an address decoder. That is, the row decoder 350 selects one of a plurality of wordlines in response to a row address. The column decoder 360 selects one of the bitline pairs in response to a column address. The Y-pass gate 370 is selected according to a control signal WMUX of the column decoder 360 to connect one of the bitline pairs with a data line pair. That is, the Y-pass gate 370 includes transistors to select one of the bitline pairs.

Among memory cells connected to a wordline selected by the row decoder 350, a memory cell connected to a bitline pair selected by the column decoder 360 and the Y-pass gate 370 is referred to as a selected memory cell.

The controller 340 controls the overall operation of the SRAM device 300 in response to control signals /CS, /OE, and /WR and an address ADD of an external device (e.g., a host, a memory controller or a memory interface). For example, the controller 340 may control read and write operations of the SRAM device 300. According to an embodiment of the inventive concept, the controller 340 may transmit a write enable signal WEN maintaining a logic high state during a write operation to the write driver 320. The controller 340 may transmit an inverted write enable signal /WEN maintaining a logic low state during the write operation to the write failure detector 332.

In some embodiments, an SRAM device 300 in accordance with the inventive concepts can further include the write driver 320 and the write assist circuit 330. The write driver 320 writes data into the memory cell 310. The write assist circuit 330 includes the write failure detector 332 and the assist voltage generator 334. The write failure detector 332 operates to detect a failure of a write operation performed by the write driver 320 and, in response, outputs the write failure signal WF. The assist voltage generator 334 outputs a write assist voltage VSSN or a write voltage VW to the write driver 320 in response to the write failure signal WF.

During the write operation, the bitline pair selected by the Y-pass gate 370 and a data line pair (DL, DLB) correspond with each other. The write driver 320 floats either of the first data line DL or the second data line DLB and applies the write voltage VW to the other data line in response to the data signal DATA. The write driver 320 may float a data line connected to a bitline which desires to apply a logic-high voltage. The write voltage VW may be a logic-low voltage and have a ground voltage level.

The write failure detector 332 receives the signal /WEN maintaining a logic low state during the write operation and a voltage level of the data line connected to a floated bitline from the controller 340. When the write operation fails, the voltage level of the floated bitline decreases and changes its logic state. When the logic state of the floated bitline changes, the write failure detector 332 detects the change as write failure and outputs a write failure signal WF. In some embodiments, when the write operation fails, the write failure detector 332 outputs a logic-high write failure signal WF. When the write operation is successfully performed, the write failure detector 332 outputs a logic-low write failure signal WF.

The assist voltage generator 334 outputs the write assist voltage VSSN or the write voltage VW according to the logic state of the write failure signal WF. The assist voltage generator 334 outputs the write assist voltage at a level lower than the write voltage VW when the write failure signal WF is logic 'high'. In some embodiments, the write voltage VW may be at the level of a ground voltage VSS, and the write assist voltage VSSN may be a negative voltage at a level that is lower than the ground voltage VSS.

As described above, the SRAM device 300 according to the inventive concepts detects a write operation failure during a write operation and performs a write assist operation only when the write operation fails. For achieving this, the write driver 320 floats one bitline of a selected bitline pair and applies a write voltage to the other bitline to perform a write operation.

Figure 8:
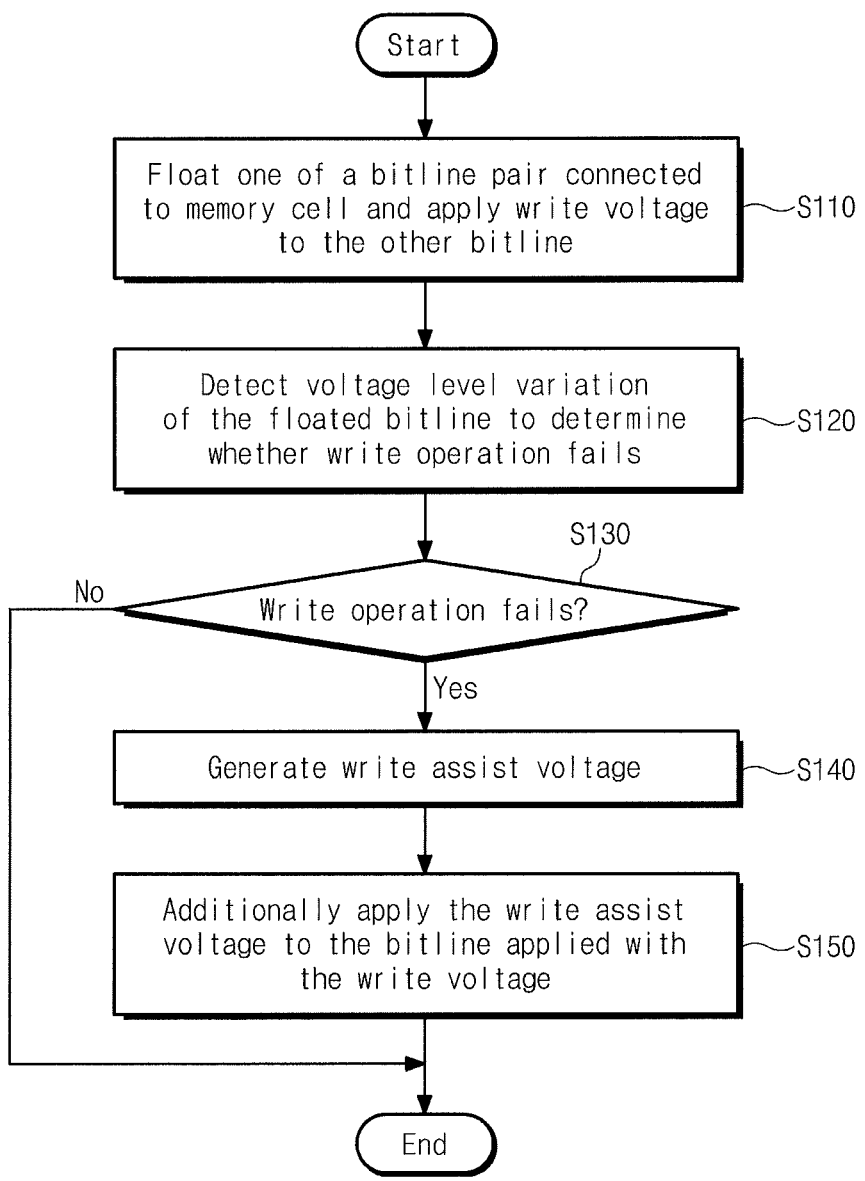
FIG. 8 is a flowchart showing a writing method of an SRAM device according to the inventive concepts.

FIG. 8 is a flowchart of a writing method of an SRAM device according to the inventive concepts. In the writing method, write operation failure is detected and a write assist operation is selectively performed only when it is determined that a write operation has failed. One bitline of a bitline pair connected to a memory cell is floated to detect failure of the write operation. The write operation will now be described below with reference to FIGS. 1 and 7.

The write driver 120 floats one bitline of a bitline pair connected to the memory cell 110 and applies a write voltage to the other bitline in response to a data signal (S110). In some embodiments, the write voltage may be a logic-low voltage, and a voltage of the floated bitline may be a logic-high voltage.

The write failure detector 132 detects change of a voltage level of the floated bitline to determine whether the write operation fails (S120 and S130). When the write operation fails, a voltage of the floated bitline may change from a logic-high voltage to a logic-low voltage. In some embodiments, the write failure detector 132 may output a logic-high write failure signal WF when the write operation fails.

The assist voltage generator 134 generates a write assist voltage VSSN when the write operation fails (S140). In some embodiments, the write assist voltage VSSN may be a negative voltage that is relatively lower than the write voltage.

In a case wherein the write operation fails, the write driver 120 additionally provides the generated write assist voltage VSSN to the bitline applied with the write voltage (S150).

According to the above-described writing method, a write assist operation is performed only at times when a write operation fails. Thus, overall power consumed during the write operation may be reduced.

Figure 9:
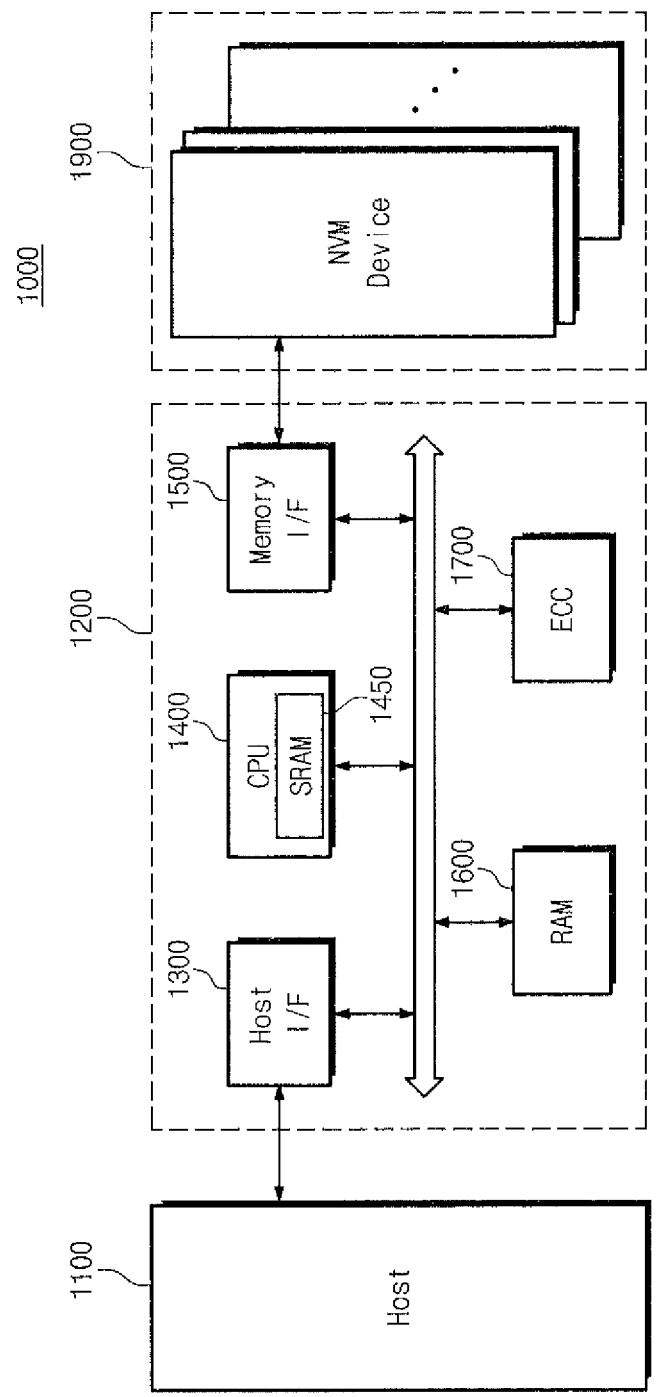
FIG. 9 is a block diagram of a user device including an SRAM device according to an embodiment of the inventive concepts.

FIG. 9 is a block diagram of a user device 1000 including an SRAM device according to an embodiment of the inventive concept. As illustrated, the user device 1000 includes a memory controller 1200 and a nonvolatile memory device 1900.

In some embodiments, the memory controller 1200 is connected to a host 1100 and nonvolatile memory devices 1900. The memory controller 1200 is configured to access the nonvolatile memory devices 1900 in response to a request from the host 1100. For example, the memory controller 12000 is configured to control read, write, and erase operations of the nonvolatile memory devices 1900. The memory controller 1200 is configured to provide an interface between the nonvolatile memory devices 1900 and the host 1100. The memory controller 1200 is configured to drive firmware for controlling the nonvolatile memory devices 1900.

The memory controller 1200 may include well known components such as a central processing unit (CPU), a host interface, an error correcting code (ECC) block, and a memory interface. A central processing unit (CPU) 1400 may include an SRAM device 1450 according to an embodiment of the inventive concepts.

In some embodiments, the RAM 1600 may be used as a working memory of the CPU 1400. The SRAM device 1450 may be used as a cache memory of the CPU 1400. The CPU 1400 controls the overall operation of the memory controller 1200.

The host interface 1300 may include a protocol to exchange data between the host 1100 and the memory controller 1200. For example, the memory controller 1200 may communicate with an external device (e.g., host) via one of various interface protocols such as USB (Universal Serial Bus), MMC (multimedia card), PCI (peripheral component interconnection), PCI-E, (PCI-express), ATA (Advanced Technology Attachment), SATA (Serial-ATA), SCSI (small computer small interface), ESDI (enhanced small disk interface), and IDE (Integrated Drive Electronics).

An error correction code (ECC) block 1700 may be configured to detect and correct an error of data read from the nonvolatile memory devices 1900. The ECC block 1700 may be provided as a component of the memory controller 1200. In other embodiments, the ECC block 1700 may be provided as a component of each of the nonvolatile memory devices 1900. The memory interface 1500 may interface the nonvolatile memory devices 1900 with the memory controller 1200.

It will be understood that components of the memory controller 1200 are not limited to the above-mentioned components. For example, the memory controller 1200 may further include a read only memory (ROM) to store code data required for an initial startup operation and data for interfacing with the host 1100.

The memory controller 1200 and the nonvolatile memory devices 1900 may be integrated into a single semiconductor device to constitute a memory card. For example, the controller 1200 and the nonvolatile memory devices 1900 may be integrated into a single semiconductor device to constitute a memory card such as a personal computer memory card international association (PCMCA) card, a compact flash card (CF), a smart media card (SM, SMC), a memory stick, a multimedia card (MMC, RS-MMC, MMC micro), an SD card (SD, mini SD, micro SD, SDHC), and a universal flash storage (UFS).

In other embodiments, the memory controller 1200 and the nonvolatile memory devices 1900 may be applied to a solid state drive (SSD), a computer, a portable computer, an ultra-mobile PC (UMPC), a workstation, a net-book, a personal digital assistant (PDA), a portable computer, a web tablet, a wireless phone, a mobile phone, a digital camera, a digital audio recorder, a digital audio player, a digital video recorder, and a digital video player, a device capable of transmitting/receiving information in wireless environment, one of various electronic devices constituting a home network, one of various electronic devices constituting a computer network, one of various electronic devices constituting a telematics network, one of various electronic devices constituting a computing system, a radio frequency identification (RFID) device or an embedded system.

The CPU 1400 of the user interface 1000 may include an SRAM device 1450 (see FIG. 1). During a write operation, the SRAM device 1450 may selectively perform a write assist operation only on a memory cell in which the write operation fails. For achieving this, the SRAM device 1450 may include the above-mentioned write driver 120 and the above-mentioned write assist circuit 130.

Figure 10:
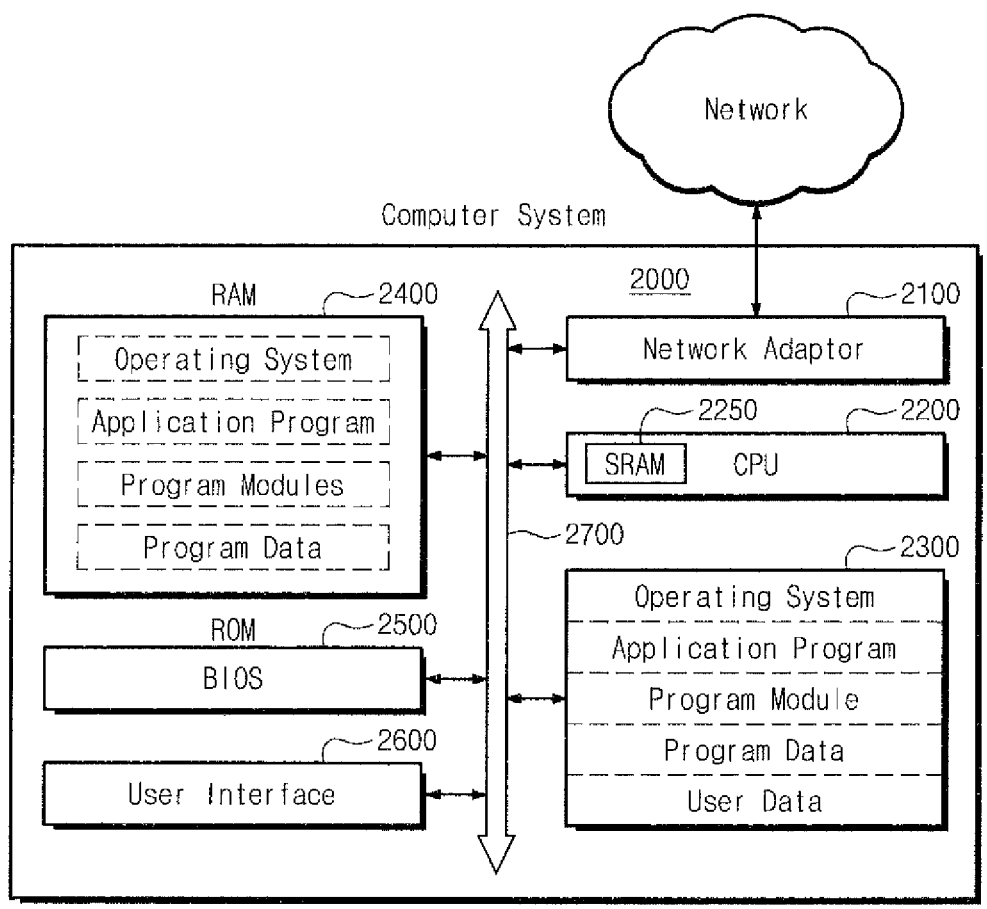
FIG. 10 is a block diagram of a computer system including an SRAM device according to an embodiment of the inventive concepts.

FIG. 10 is a block diagram of a computer system 2000 including an SRAM device according to an embodiment of the inventive concept. As illustrated, the computer system 2000 includes a network adaptor 2100, a central processing unit (CPU) 2200, a data storage device 2300, a RAM 2400, a ROM 2500, and a user interface 2600 which are electrically connected to a system bus 2700. The CPU 2200 includes an SRAM device 2250 according to an embodiment of the inventive concept.

The network adaptor 2100 provides interfacing between the computer system 2000 and external networks. The CPU 2200 performs the overall operation processing to drive an operating system (OS) or an application program that is resident in the RAM 2400. The CPU 2200 may use the SRAM device 2250 as a cache memory to perform the operation processing. The SRAM device 2250 may apply a negative voltage to a selected bitline, and an unselected wordline, and a pass gate of a selected bitline during a write operation. The SRAM device 2250 may apply a negative voltage to a pass gate of a selected bitline and a ground node of a sense amplifier during a read operation. Thus, the SRAM device 2250 may stably perform the read and write operations.

The data storage device 2300 stores the overall data required in the computer system 2000. For example, the data storage device 2300 stores an operating system (OS) to drive the computer system 2000, an application program, various program modules, program data, and user data.

The RAM 2400 may be used as a working memory of the computer system 2000. The operating sys (OS), the application program, the various program modules, and the program data used to drive programs, which are read from the data storage device 2300, are loaded into the RAM 2400 during a startup operation. A basic input/output system (BIOS), which is activated before the OS is driven, is stored in the ROM 2500 during the startup operation. Information exchanges between the computer system 2000 and a user through the user interface 2600.

The computer system 2000 may further include a battery, a modem, and the like. Although not shown in the figure, it will be understood that the computer system 2000 may further include an application chipset, a camera image processor (CIS), a mobile DRAM, and the like.

As described herein, failure of a write operation is detected using change of a voltage level of a bitline that is floated during the write operation. A write assist operation is performed only when the write operation fails. Thus, the relative amount of power consumed during the write operation may be reduced.

While the present disclosure has been particularly shown and described with reference to exemplary embodiments thereof, the general inventive concepts are not limited to the above-described embodiments. It will be understood by those of ordinary skill in the art that various changes and variations in form and details may be made herein without departing from the spirit and scope of the inventive concepts as defined by the following claims.

What is claimed is:

1. A static random access memory device comprising:
    a write driver configured to float either of a first bitline and a second bitline connected to a memory cell and to apply a write voltage to the other bitline in response to a logic state of a data signal;
    a write failure detector configured to receive a voltage of the floated bitline and output a write failure signal; and
    an assist voltage generator configured to generate a write assist voltage in response to the write failure signal,
    wherein the write driver additionally provides the write assist voltage to the bitline to which the write voltage is applied.

2. The static random access memory device as set forth in claim 1, wherein the voltage of the floated bitline is a logic-high voltage and the write voltage is a logic-low voltage.

3. The static random access memory device as set forth in claim 2, wherein the write assist voltage is a negative voltage at a voltage level lower than the write voltage.

4. The static random access memory device as set forth in claim 3, wherein the write driver comprises:
    a first inverter configured to receive and invert the data signal before outputting the data signal;
    a first write transistor having one end connected to the first bitline and the other end connected to an output terminal of the assist voltage generator and being turned on or off in response to an output signal of the first inverter; and
    a second write transistor having one end connected to the second bitline and the other end connected to the output terminal of the assist voltage generator and being turned on or off in response to the data signal, and
    wherein turn-on/off operations of the first and second write transistors are complementary to each other.

5. The static random access memory device as set forth in claim 4, wherein the write failure detector comprises:
    a first select transistor configured to output a voltage of the first bitline as a first select signal in response to the data signal;
    a second select transistor configured to output a voltage of the second bitline as a second select signal in response to the output signal of the first inverter; and
    a logic unit configured to receive the first select signal or the second select signal as a first input signal and receive and logically operate an write enable signal maintaining a logic low state during a write operation as a second input signal to output a write failure signal, and
    wherein the first input signal is a voltage of the floated bitline.

6. The static random access memory device as set forth in claim 5, wherein the logic unit outputs a logic-high write failure signal when the first input signal is a logic-low voltage.

7. The static random access memory device as set forth in claim 6, wherein the logic unit is a NOR logic gate.

8. The static random access memory device as set forth in claim 3, wherein the assist voltage generator comprises:

an inverter chain including first to third inverters connected in series and receiving and inverting the write failure signal to output an assist voltage control signal;

a capacitor having one end connected to an output terminal of the inverter chain and the other end connected to an output terminal of the assist voltage generator and outputting the write assist voltage in response to the assist voltage control signal; and a pull-down transistor having one end connected to a ground voltage and the other end connected to the output terminal of the assist voltage generator and outputting a ground voltage in response to an output signal of the first inverter.

9. The static random access memory device as set forth in claim 8, wherein the assist voltage generator outputs the write assist voltage when the write failure signal is logic low and outputs a ground voltage when the write failure signal is logic high.

10. A static random access memory device comprising:
memory cells connected to wordlines and bitlines pairs, respectively;

an address decoder configured to select one of the memory cells in response to an address signal;

a write driver configured to float one bitline of a bitline pair connected to the memory cell selected by the address decoder and to apply a write voltage to the other bitline;

a write failure detector configured to detect change of a voltage level of the floated bitline to output a write failure signal; and an assist voltage generator configured to output a write assist voltage in response to the write failure signal, wherein the write failure detector outputs a write failure signal corresponding to write operation failure when a logic state of the voltage level of the floated bitline changes, and the write driver additionally applies the write assist voltage to the bitline to which the write voltage is applied.

11. The static random access memory device as set forth in claim 10, wherein the write driver floats a first bitline of the bitline pair and applies the write voltage to a second bitline of the bitline pair when the data signal is logic high, and applies the write voltage to the first bitline and floats the second bitline of the bitline pair when the data signal is logic low.

12. The static random access memory device as set forth in claim 11, wherein a voltage level of the floated bitline is a precharge voltage level and a level of the write voltage is a ground voltage level.

13. The static random access memory device as set forth in claim 12, wherein the write failure detector outputs the write failure signal that is a logic-high voltage when the voltage level of the floated bitline changes from a logic-high level to a logic-low level.

14. The static random access memory device as set forth in claim 13, wherein the write assist voltage generator outputs a write assist voltage that is a negative voltage at a voltage level lower than the write voltage in response to the write failure signal.

15. The static random access memory device as set forth in claim 10, wherein the write assist voltage generator outputs a ground voltage to the write driver when the write failure signal is a logic-low voltage.

16. A write assist operation unit coupled to a bitline pair of a memory device comprising:

a write failure detection circuit that determines when a write error occurs in response to a voltage level of a first bitline of the bitline pair that is in a floated state, the write detection circuit generating a write failure signal in response to a determination of the occurrence of a write error; and a write driver unit that receives the write failure signal and selectively applies a write assist voltage to the first bitline of the bitline pair only when the write failure signal indicates the occurrence of a write error and otherwise applies a write voltage to the first bitline of the bitline pair when the write failure signal indicates the non-occurrence of a write error.

17. The write assist operation unit of claim 16 wherein the write assist voltage is at a voltage level that is lower than that of the write voltage.

18. The write assist operation of claim 17 wherein the write assist voltage is at a negative voltage level.

19. The write assist operation unit of claim 16 further comprising a write driver that places the first bitline of the bitline pair in a floating state and that applies a write voltage to a second bitline of the bitline pair during a write operation.

20. The write assist operation unit of claim 16 wherein the write failure detection circuit determines an occurrence of a write error based on a voltage of the first bitline decreasing below a threshold voltage.

\* \* \* \* \*